United States Patent [19]

Sakamoto

[11] Patent Number: 4,857,849

[45] Date of Patent: Aug. 15, 1989

[54] HIGH FREQUENCY MAGNETIC FIELD GENERATOR FOR NUCLEAR MAGNETIC RESONANCE

[75] Inventor: Hidenobu Sakamoto, Hyogo, Japan

[73] Assignee: Mitsubishi Denki Kabushiki Kaisha, Tokyo, Japan

[21] Appl. No.: 172,885

[22] Filed: Mar. 25, 1988

[30] Foreign Application Priority Data

Mar. 25, 1987 [JP] Japan ............................. 62-69034
Aug. 11, 1987 [JP] Japan ............................. 62-199063

[51] Int. Cl.$^4$ ................................ G01R 33/20
[52] U.S. Cl. ........................ 324/318; 324/316
[58] Field of Search ............. 324/300, 307, 309, 314, 324/316, 318, 322, 313

[56] References Cited

U.S. PATENT DOCUMENTS 4,703,267  10/1987  Maudsley ........................... 324/309
4,766,383  8/1988  Fox et al. ........................... 324/318

Primary Examiner—Stewart J. Levy
Assistant Examiner—Kevin D. O'Shea
Attorney, Agent, or Firm—Sughrue, Mion, Zinn, Macpeak & Seas

[57] ABSTRACT

The high frequency magnetic field generating portions are arranged at spatially different positions, respectively, and high frequency currents having phase difference corresponding to a spatial deviation between the high frequency magnetic field generating portions are supplied to the high frequency magnetic field generating portions, resultant high frequency magnetic fields being combined to produce a single rotating magnetic field.

9 Claims, 2 Drawing Sheets

FIG. 1
PRIOR ART
FIG. 2
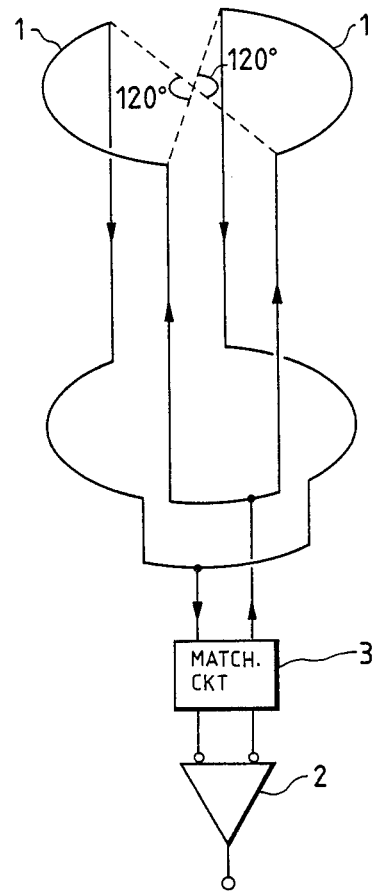
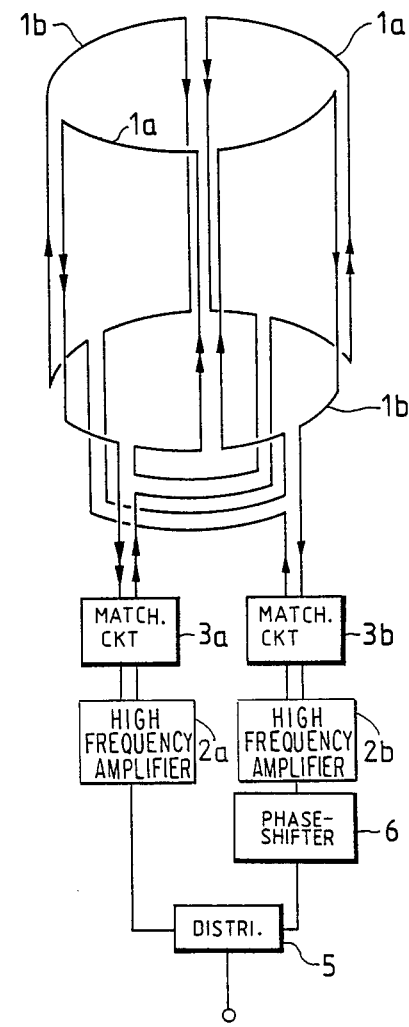

HIGH FREQUENCY MAGNETIC FIELD GENERATOR FOR NUCLEAR MAGNETIC RESONANCE

BACKGROUND OF THE INVENTION

The present invention relates to a high frequency magnetic field generator for nuclear magnetic resonance (NMR) or electron spin resonance (EPR) and, particularly, to a high frequency coil device having transmission coil means, receiving coil means or transmission/receiving coil means.

FIG. 1 shows schematically a conventional high frequency magnetic field generator for NMR. The magnetic field generator includes a high frequency amplifier 2 connected to a high frequency input terminal, an impedance matching circuit 3 connected to the high frequency amplifier 2 and a high frequency magnetic field generating portion composed of a pair of opposing and parallel connected high frequency coils 1 having opposite ends connected to the impedance matching circuit 3. Each coil takes in the form of saddle making an angle of 120°, generally.

A high frequency signal supplied to the high frequency input is amplified by the high frequency amplifier 2. An output of the amplifier 2 is supplied through the impedance matching circuit 3 to the high frequency coils 1 by which a vibrating magnetic field is produced in a region defined therebetween, which is time-dependent similarly to high frequency current supplied thereto. The impedance matching circuit 3 serves to match an output impedance of the amplifier 2 to an impedance of the coils 1 to thereby provide a smooth transmission of the amplified signal between them.

In a receiving operation mode, a NMR signal emitted from the substance disposed in the region defined between the coils 1 is received by these coils. The NMR signal produces a rotating magnetic field by which a high frequency sinusoidal current is induced in the coils. The induced current is tuned by the matching circuit 3 and sent through a preamplifier (not shown) to a suitable receiving device by synchronous electrical switches.

In the conventional high frequency magnetic field generator for NMR, high frequency magnetic field to be generated is a linearly polarized vibrating field and, assuming that an amplitude of rotating magnetic field is $\sqrt{2}$ B, an amplitude of vibrating magnetic field is $2\sqrt{2}$ B. Therefore, only one of two opposite rotating magnetic fields of the vibrating magnetic field can be utilized as an effective rotating magnetic field for NMR or EPR. That is, only half of the power supplied can be used as an effective power. Further, a receiving efficiency of NMR signal from the substance is relatively low and an S/N ratio is determined by a noise level of the coils 1, so that noise is supplied directly to the receiving device.

SUMMARY OF THE INVENTION

An object of the present invention is to provide a high frequency magnetic field generator for nuclear magnetic resonance in which high frequency power necessary to generate an effective rotating magnetic field is minimized and thus it is possible to reduce high frequency power irradiating a substance to be NMR-tested.

Another object of the present invention is to provide a high frequency coil device in which transmitted power is effectively utilized and NMR signal can be received with high efficiency with high S/N ratio to thereby reduce noise relatively.

According to the present invention, the above objects are achieved by a high frequency magnetic field generator comprising at least a pair of oppositely arranged high frequency magnetic field generating portions and a phase shifter for shifting the phase of a high frequency current to be supplied to the high frequency magnetic field generating portions by an amount corresponding to a spatial deviation between the high frequency magnetic field generating portions.

In this invention, the high frequency magnetic field generating portions are arranged at spatially different positions, respectively, and high frequency currents having phase difference corresponding to the spatial deviation are supplied to the high frequency magnetic field generating portions, resultant high frequency magnetic fields being combined to produce a single rotating magnetic field.

BRIEF DESCRIPTION OF THE DRAWINGS

FIG. 1 shows a construction of an example of a conventional high frequency magnetic field generator for NMR;

FIG. 2 shows a construction of an embodiment of the present invention, schematically;

DETAILED DESCRIPTION OF THE PREFERRED EMBODIMENT

Figure 3:
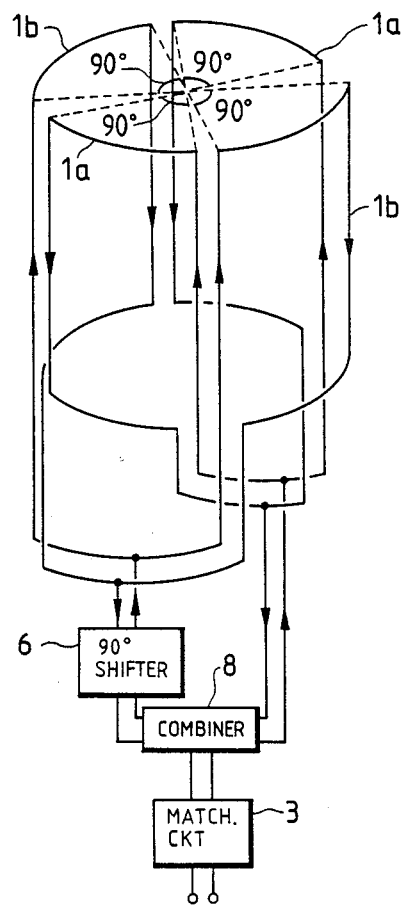
FIG. 3 shows another embodiment of the present invention.

In Fig. 2, an embodiment of the present invention comprises a first high frequency amplifier 2a, a first impedance matching circuit 3a, a high frequency magnetic field generating portion 1a, a second high frequency amplifier 2b, a second impedance matching circuit 3b and a high frequency generating portion 1b. Further, this embodiment includes a distributor 5 for supplying a high frequency signal supplied to an input portion of the device to the high frequency amplifiers 2a and 2b and a phase shifter 6 for shifting phase of one of the signals from the distributor 5 by 90° with respect to the other. The distributor 5 and the phase shifter 6 constitute a phase shifting means for shifting a phase of high frequency current supplied to the high frequency magnetic field generating portion 1a with respect to that of the portion 1b by an amount corresponding to a spatial deviation of the high frequency magnetic field generating portion 1a from the portion 1b.

The high frequency signal supplied to the distributor 5 is divided thereby into two components one of which is supplied directly to the amplifier 2a and, after being amplified, passes through the impedance matching circuit 3a to the high frequency magnetic field generating portion 1a to generate a vibrating field a. The other component from the distributor 5 is shifted in phase by 90° by the phase shifter 6. An output signal of the phase shifter 6 is amplified by the amplifier 2b and supplied through the impedance matching circuit 3b to the high frequency generating portion 1b to generate a vibrating field b.

Expressing the high frequency signal supplied to the input portion of the device by A sin ωt and the vibrating magnetic field a by B sin ωt, the vibrating magnetic field b produced by the high frequency magnetic field generating portion 1b becomes -B sin (ωt-90°), resulting in a composite rotating magnetic field having amplitude of $\sqrt{2}$ B and phase of ωt+45°.

In this embodiment, two, mutually opposing high frequency magnetic field generating portions 1a and 1b each composed of a pair of parallel saddle-shaped coils each making an angle of about 90° are used. However, the number of the high frequency magnetic field generating portions is arbitrary so long as high frequency currents are supplied to the high frequency magnetic field generating portions with mutual phase difference of 360°/n where n is the number of the high frequency magnetic field generating portions.

Further, in this embodiment, although the phase shifting means is constituted with the distributor 5 and the phase shifter 6, it is possible to remove the phase shifter 6 when the distributor 5 comprises a 90° hybrid circuit capable of providing two outputs having a phase difference of 90°.

Further, it is possible to use a single high frequency amplifier and wherein an output of the latter is divided into two components one of which is shifted in phase by 90° with respect to the other.

FIG. 3 shows another embodiment of the present invention which includes a pair of high frequency magnetic field generating portions 1a and 1b which are the same as those shown in FIG. 2. In this embodiment, a single matching circuit 3 having inputs connected to the input portion of the device is used. Outputs of the matching circuit 3 are connected to a combiner 8 having outputs connected to one of the high frequency magnetic field generating portions 1a and 1b and through a 90° phase shifter 6 to the other, respectively. The combiner 8 serves to combine outputs of the high frequency magnetic field generating portions 1a and 1b. The phase shifter 6, the combiner 8 and the matching circuit 3 constitute a phase shift/matching means for providing a phase shift corresponding to a spatial position difference between the portions 1a and 1b and in turn between high frequency currents induced in the high frequency magnetic field generating portions 1a and 1b.

It is assumed that a NMR signal is expressed by Q exp (-jωt) where Q is amplitude, ω is angular frequency and t is time and that the NMR signal rotates in counterclockwise direction in a plane including centers of the high frequency magnetic field generating portions 1a and 1b within the region defined by these portions 1a and 1b. In such case, high frequency current induced in the portion 1a is -R sin ωt and that induced in the portion 1b is -R cos ωt (R being a constant). Since the high frequency current induced in the portion 1b is supplied through the phase shifter 6 to the combiner 8, an output of the combiner 8 becomes −2R sin ωt.

On the other hand, since noises produced in the high frequency magnetic field generating portions 1a and 1b have random phase, they are cancelled by each other by the combiner 8 and the value of combined noise is $\sqrt{2}$ times larger and therefore an S/N ratio of the composite signal at the output of the combiner 8 becomes $\sqrt{2}$ times that obtainable with a single high frequency magnetic field generating portion. The composite signal is sent from the combiner 8 to the matching circuit 3 and then sent to the receiver. Since the substance to be tested is disposed in the region surrounded by the high frequency magnetic field generating portions 1a and 1b, the NMR signal is effectively received thereby.

It should be noted at this time that the phase shifter 6 in the present invention may be substituted by a delay circuit having a delay corresponding to phase shift to be given thereby.

Figure 4:
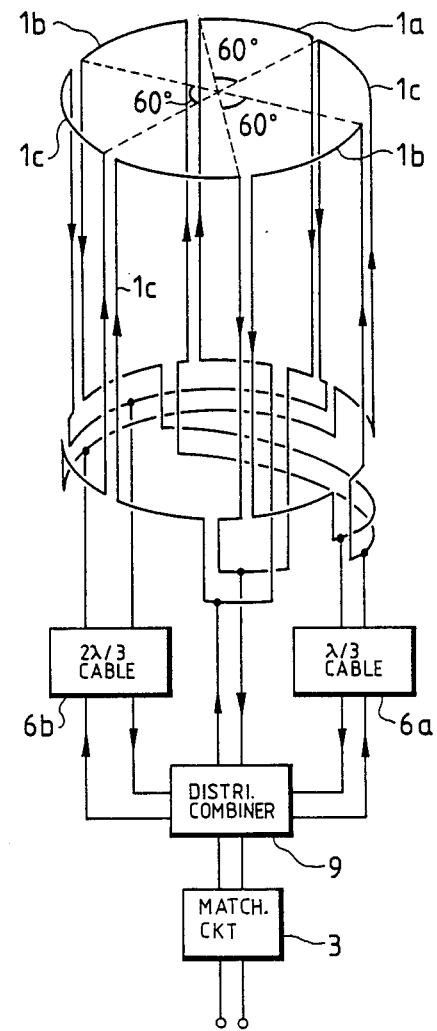
FIG. 4 is a further embodiment of the present invention.

FIG. 4 shows another embodiment of the present invention in which three high frequency magnetic field generating portions 1a, 1b and 1c each composed of a pair of high frequency parallel coils are used.

In this embodiment, the portion 1a is directly connected to a distributor-combiner 9, the portion 1b is connected through a ($\frac{1}{3}$) λ cable 6a having an electric length of (2π/3) to the distributor-combiner 9 and the portion 1c is connected through a ($\frac{2}{3}$) λ cable 6b having an electric length of 4 π/3 to the distributor-combiner 9, where λ is the wavelength of the NMR signal. The distributor-combiner 9 is connected to the matching circuit 3. In this embodiment, the λ/3 cable 6a, the 2λ/3 cable 6b, the distributor-combiner 9 and the matching circuit 3 constitute a phase shifting-matching means.

In signal transmission mode, high frequency current supplied through the matching circuit 3 to the distributor-combiner 9 is divided into three components which are supplied directly to the high frequency magnetic field generating portion 1a, through the λ/3 cable 6a to the portion 1b and through the ($\frac{2}{3}$)λ cable 6b to the portion 1c, respectively. The current components supplied to the respective high frequency magnetic field generating portions are different in spatial phase from each other by 2π/3 and act to generate a rotating high frequency magnetic field in a space defined by these portions, effectively.

In a receiving mode, rotating NMR signal generates a rotating magnetic field in the space upon which high frequency currents having a phase difference of 2λ/3 from each other are induced in the respective portions 1a, 1b and 1c. These currents are supplied to the distributor-combiner 9 directly, through the ($\frac{1}{3}$) λ cable 6a and through the ($\frac{2}{3}$) λ cable 6b, respectively, as mentioned previously. Therefore, noise components of these currents are averaged. The combined current is supplied through the matching circuit 3 to the receiver.

The number of the high frequency magnetic field generating portions is arbitrary. That is, the same effect is obtainable with n high frequency magnetic field generating portions by arranging them such that the spatial deviation θ=2 π/n of the high frequency magnetic field generating portions is obtained and by making high frequency currents to be supplied to these portions or high frequency signals to be received by them in phase by means of a circuit or circuits having electric length a multiple of 2 π/n.

Such circuit or circuits may be a phase shifter or shifters which are capable of producing required phase shifts.

Although the present invention has been described with reference to an application to the NMR, it is also applicable to EPR.

What is claimed is:

1. A high frequency magnetic field generator comprising at least a pair of parallel, saddle-shaped high frequency magnetic field generating portions arranged oppositely about a longitudinal axis and phase shifting means for producing a phase shift corresponding to an amount of spatial positional deviation between said high frequency magnetic field generating portions and in turn between corresponding high frequency currents supplied to said respective high frequency magnetic field generating portions.

2. The high frequency magnetic field generator as claimed in claim 1, wherein said phase shifting means comprises a distributor for dividing an input high frequency signal into n components where n is an integer not less than 2 and a phase shifter for shifting phases of said n signal components to be supplied to or received from said high frequency magnetic field generating portions by $2\pi/n$ from each other.

3. The high frequency magnetic field generator as claimed in claim 2, wherein said input high frequency signal is amplified after being divided and phase shifted.

4. A high frequency coil device comprising at least a pair of transmitting and receiving coil means each composed of a pair of parallel, saddle-shaped coils arranged oppositely about a longitudinal axis and phase shifting and matching means connected to said respective transmitting and receiving coil means for shifting a mutual phase of high frequency currents flowing therethrough by an amount corresponding to a spatial position deviation therebetween and for performing a tuning and impedance matching thereof.

5. The high frequency coil device as claimed in claim 4, wherein a relation $\theta = 2\pi/n$ is established between the number n of said transmitting and receiving coil means and said spatial positional deviation $\theta$ therebetween.

6. The high frequency coil device as claimed in claim 4, wherein said phase shifting and matching means comprises a 90° phase shifter connected to one of said transmitting and receiving coil means, a combiner connected to said 90° phase shifter and to the other of said transmitting and receiving coil means for combining outputs of said 90° phase shifter and said the other transmitting and receiving coil means and a matching circuit connected to said combiner for performing a tuning and an impedance matching.

7. The high frequency coil device as claimed in claim 4 or 5, wherein three said transmitting and receiving coil means are used and wherein each said phase shifting and matching means comprises an electric circuit connected to each of two of said three transmitting and receiving coil means and having an electric length having a phase difference corresponding to a spatial positional deviation between adjacent ones of said three transmitting and receiving coil means, a distributor-combiner connected to the remaining transmitting and receiving coil means and to said electric circuits for performing a signal distribution and a signal combination and a matching circuit connected to said distributor-combiner for a tuning of said signal and an impedance matching.

8. The high frequency coil device as claimed in claim 7, wherein said electric circuits are a $\lambda/3$ cable and a $2\lambda/3$ cable, respectively.

9. A high frequency coil device comprising at least a pair of transmitting and receiving coil means each composed of a pair of parallel coils arranged oppositely about a longitudinal axis and phase shifting and matching means connected to said respective transmitting and receiving coil means for shifting a mutual phase of high frequency currents flowing therethrough by an amount corresponding to a spatial position deviation therebetween and for performing a tuning and impedance matching thereof, and wherein three said transmitting and receiving coil means are used and wherein each said phase shifting and matching means comprises an electric circuit connected to each of two of said three transmitting and receiving coil means and having an electric length having a phase difference corresponding to a spatial positional deviation between adjacent ones of said three transmitting and receiving coil means, a distributor-combiner connected to the remaining transmitting and receiving coil means and to said electric circuits for performing a signal distribution and a signal combination and a matching circuit connected to said distributor-combiner for a tuning of said signal and an impedance-matching.

* * * * *